United States Patent [19]

Glaubitz

[11] 4,184,153
[45] Jan. 15, 1980

[54] DISPLAY APPARATUS HAVING A PASSIVE ELECTRO-OPTICAL DISPLAY

[75] Inventor: Werner Glaubitz, Munich, Fed. Rep. of Germany

[73] Assignee: Siemens Aktiengesellschaft, Berlin & Munich, Fed. Rep. of Germany

[21] Appl. No.: 940,786

[22] Filed: Sep. 8, 1978

[30] Foreign Application Priority Data

Oct. 18, 1977 [DE] Fed. Rep. of Germany ....... 2746818

[51] Int. Cl.² .................................................. G02F 1/13
[52] U.S. Cl. ..................................... 340/765; 340/380; 340/784; 350/96.34; 350/345
[58] Field of Search .............................. 340/380, 765; 350/96.11, 96.34, 345

[56] References Cited

U.S. PATENT DOCUMENTS

| | | | |
|---|---|---|---|
| 3,887,791 | 6/1975 | Kitchens | 340/380 X |
| 3,966,303 | 6/1976 | Yamamoto | 350/345 |
| 4,068,924 | 1/1978 | Kotani | 350/345 |
| 4,088,992 | 5/1978 | Kmetz et al. | 340/765 |
| 4,104,627 | 8/1978 | Thuler | 350/345 |
| 4,118,111 | 10/1978 | Laesser | 350/345 X |

OTHER PUBLICATIONS

W. Greubel and G. Baur; "Das Fluoreszenz–Aktivierte Display, Flad;" Elektronik, 1977, Heft 6; pp. 55, 56.

*Primary Examiner*—David L. Trafton
*Attorney, Agent, or Firm*—Hill, Van Santen, Steadman, Chiara & Simpson

[57] ABSTRACT

A display apparatus has a passive electro-optical display. The apparatus has a housing with a lower part in a form of a rectangle which is open upwardly and has a cover which carries the display in a position inclined with respect to the plane of the base of the rectangular-shaped lower part of the housing. The display apparatus has a cover surface which is formed at least in one area of a plate which supports the display, the plate consisting of a material having an index of refraction which is greater than one, and which contains particles which are fluorescent. That portion of the cover also has a plurality of light emergence windows aligned with the various elements of the display and is advantageously metallized at its peripheral edges. The display is supported on the surface of the cover and the cover includes transitions from one planer area to another which are defined in accordance with the relation $$R \geq (d \cdot n_f)/(n_f - n_a)$$

where R is the exterior radius of curvature, d is the thickness of the cover plate, $n_f$ is the refractive index of the plate and $n_a$ is the refractive index of the outside area, for example air. The display has electrical contacts which abut at least one of the two narrow sides of the display and are extended through the plate into the interior of the housing through a recess in the portion of the plate which carries the display. A frame, having three or four sides surrounds the display and is connected with the fluorescent plate.

18 Claims, 2 Drawing Figures

DISPLAY APPARATUS HAVING A PASSIVE ELECTRO-OPTICAL DISPLAY

BACKGROUND OF THE INVENTION

1. Field of the Invention

The present invention relates to a display apparatus of the type which comprises a passive electro-optical display which has rectangular display area and housing having a lower part in the form of a rectangle that opens upwardly and has a cover which carries the display in a position which is inclined toward the plane of the rectangular lower part, and in which the two longitudinal sides of the rectangular display area lie in parallel planes relative to the plane of the lower housing part and in which the two narrow sides of the rectangular display area are in angle with respect to that plane.

2. Description of the Prior Art

Instruments constructed in the general form noted above are well known in the art, for example one may refer to "Electronics Engineer" 6, (1976), pp. EL1-EL6.

The display contrast in passive displays can be considerably increased when the actual display cell is combined with a so-called fluorescent plate. A fluorescent plate consists of a carrier material which is enriched with fluorescing particles with a refractive index which is greater than one, and which is metallized at its edges and has specific light emergence windows. Such a body collects a great share of the ambient light impinging thereon by means of fluorescent emission and subsequent reflections at its bound surfaces, and the carrier material conveys the captured radiation within itself and emits the same again through its light emergence windows. If an electro-optical display is placed over a fluorescent plate, the display whose display elements are aligned with the light emergence windows, the luminosity of the display is increased by a factor which corresponds to the ratio of the light-collecting to the light-emitting body surface, in a first approximation. More precise details concerning such a display technique is described, and is generally known in the art, in association with the FLAD (fluorescence-activated display), as can be determined, for example, from the article "Light and Economical," published in "Electronics News" on Mar. 25, 1977, or from an article in "Electronics Engineer" 6, (1977) 55.

A FLAD housing must be designed such that the fluorescent plate has a collector surface as large as possible and that the captured light is fed to the individual light emergence windows with the lowest possible losses. Care must therefore by taken that the display still can be satisfactorily recognized in a larger angle range and that the total design has an aesthetic appeal.

SUMMARY OF THE INVENTION

In order to fulfill the aforementioned requirements, the display apparatus of the present invention is particularly characterized in that the cover surface is formed by a plate, at least in an area containing the display, such that the plate consists of a material having a refractive index which is greater than one and contains particles which are fluorescent. The plate also has edges which are advantageously metallized to reflect the light and the display is carried by a portion of the plate which is not parallel to the general plane of housing. The transitions of the surface which carries the plate, with respect to the remaining surfaces of the fluorescent plate are determined by the relationship $$R \geq (d \cdot n_f)/(n_f - n_a)$$

where R is the external radius of curvature, d is the thickness of the fluorescent plate, $n_f$ is the refractive index of the fluorescent plate and $n_a$ is the refractive index of the exterior space, such as air, water, etc. The electrical contacts of the display, such as zebra rubber contacts but at least one of the two narrow sides of the display area and are extended through a recess in the plate to contact a circuit board therebeneath. A frame, preferably a three-sided frame is placed over the display and connected to the fluorescent plate.

In a particular embodiment of the invention, the ambient light is captured on a large surface and is conveyed practically without detours directly to the light-emergence windows, as the plate openings for the electric contacting are situated at the narrow sides of the rectangular display surface, rather than at the conventional broad sides. One need not be concerned about the normally critical bending points, as the radiation is deflected into the new directed by means of multiple total reflection on a basis of the required relation for the radii of curvature. In this connection, one may refer to the earlier German application P 27 24 748. An additional advantage can be seen in that the total housing cover can be particularily economically produced and can be readily assembled. The fluorescent plate can be produced in an injection molding process and can perhaps make do without metallization. The display can be releasably locked into the position with a handle, together with the frame which is advantageously carried out as plug-in type construction and which engages the correct position on the plate, and the total cover unit can be easily handled and can be quickly combined with the remaining components of the instrument.

BRIEF DESCRIPTION OF THE DRAWINGS

Other objects, features and advantages of the invention, its organization, construction and operation will be best understood from the following detailed description of preferred embodiments thereof, taken in conjunction with the accompanying drawings, on which.

DESCRIPTION OF THE PREFERRED EMBODIMENT

Figure 1:
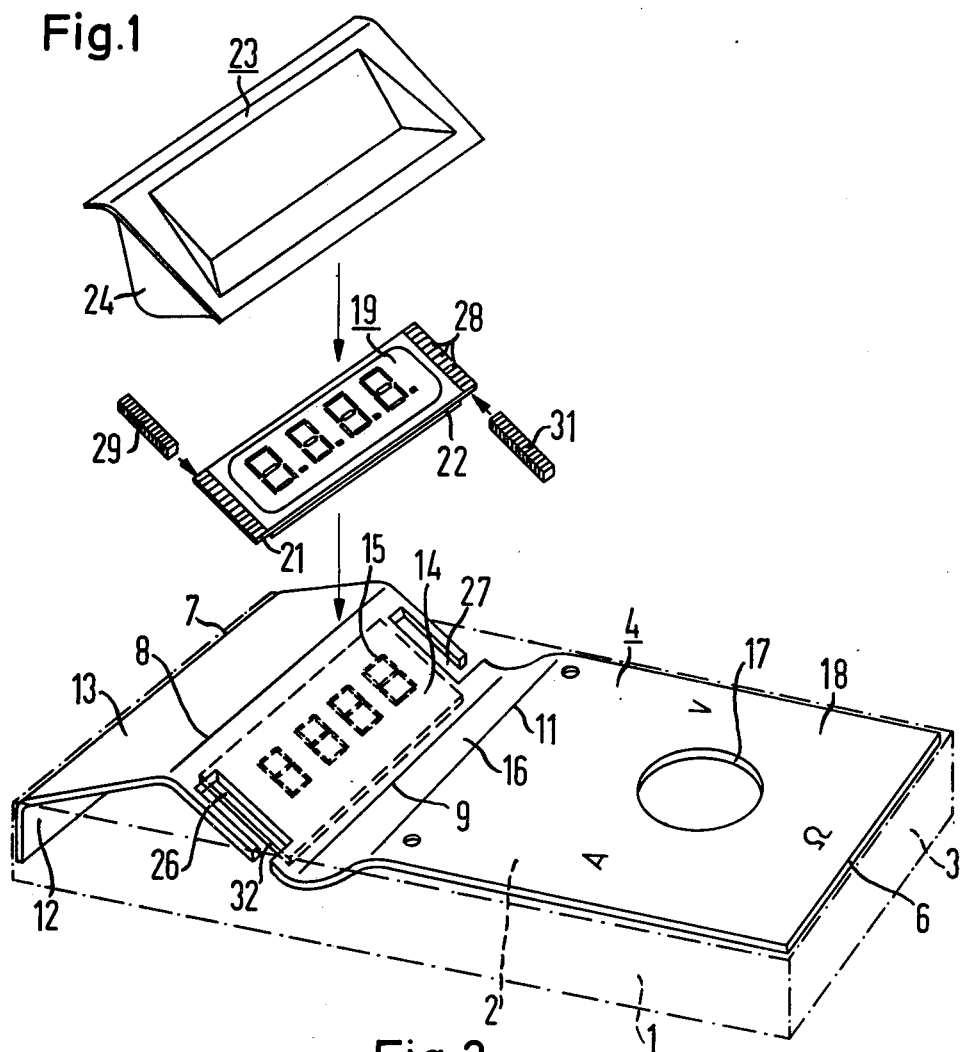
FIG. 1 is a pictorial explosed view of an exemplary embodiment of the invention.

The figures on the drawing are provided herein in a purely schematic form for the sake of simplicity and clarity. Individual components of a display instrument, which are not absolutely necessary for the understanding of the invention, such as the electric actuation modules or the control elements accommodated in the interior of the housing, have been provided without reference or have been totally omitted.

Referring to FIG. 1., an instrument is illustrated for the display of electrical magnitudes, such as the amount of current, voltage or impedance which values can be selectively measured. The apparatus has a rectangular lower housing part 1 (shown in broken line view on the drawing) having a base 2 and lateral surface 3, including a housing cover 4. In the present exemplary embodiment, the total housing cover comprises a fluorescent plate provided at its lateral surfaces with respective reflection layer 6. From the drawing it can be concluded that the fluorescent plate, rectangular in top view, is bent four times, about respective axes 7, 8, 9 and 11 which extend transversely to the longitudinal direction of the plate. These four folding edges separate five portions of the fluorescent plate from one another, namely: an edge portion 12, a top portion 13, a carrier surface 14 containing light emergence windows 15, a transition portion 16 and a control portion 18 which is provided with a circular opening 17. The edge portion 12 extends perpendicularly with respect to the general plane of the rectangular housing, and the control portion extends parallel to the plane of the housing, while the remaining portions 13, 14 and 16 are inclined with respect to such an extension plate such that the folding axis 7 which the portions 12 and 13 abut, lies approximately at the height of the control portion 18, the folding axis 8 between the portions 13 and 14 lies above the level of the control portion 18, the folding axis 9, lying between the portion 14 and the transition surface 16, lies below the level of the control portion 18, and the control portion 18, of course, lies generally parallel to the general rectangular plane of the housing. The fluorescent plate, in longitudinal section, has in this geometry a profile with a V-shaped depression and an inverted V-shaped projection. The folding axis or edges 8, 9 and 11 are respectively rounded off, such that the exterior radii of curvature have the relation $$R \geq (d \cdot n_f)/(n_f - n_a)$$

where R is the external radius of curvature, d is the thickness of the plate, $n_f$ is the refractive index of the fluorescent plate and $n_a$ is the refractive index of air, water, etc.

A four-digit display on a liquid crystal base, the liquid crystal display 19, is supported on the carrier surface in such a position that the light emergence windows 15 are aligned with the display elements of the display. In the perspective view of FIG. 1, only two carrier plates (the front plate 21 and the rear plate 22) can be seen of the liquid crystal display. A more detailed illustration of the construction and the operating characteristics of liquid crystal displays can be found, for example, in "VDI-Z" 115(1973) 629. The display 19 is supported and covered by a frame 23, which is rectangular in a top view thereof. The frame 23 includes two tongues at its two narrow sides, of which only one tongue 24 can be seen on the drawing. The tongues project into respective openings 26, 27 of the carrier plate 14 in an assembled condition. It is not necessary to use fluorescent material for the frame, as the light collected thereby, cannot readily be conveyed to the fluorescent plate and would thus be only marginally available for the display.

The front plate 21 of the liquid crystal display 19 contains electrical contacts 28 which are necessary for display actuation, the contacts 28 being located at the two narrow sides of the rectangular base surface. The so-called zebra contact rubbers 29, 31 which are, as is well known in the art, only electrically conductive in directions which are transversed to their longitudinal direction, are respectively situated behind the two contact strips. These contact elements rest on a circuit plate 32. In an assembled apparatus, the frame tongues respectively provided with a projection, embrace the circuit plate 32 so that the fluorescent plate, the display, the zebra contact rubbers, the circuit plate and the frame together form a structural unit of reciprocally supporting individual components.

On the control surface 18 of the fluorescent plate, several symbols, in the exemplary embodiment the letters "A", "V" and "Ω," necessary for the operation are located as luminous light emergence windows. The three letters indicate the positions into which a switch-extending through the opening 17 in a finished instrument--is to be mounted positioned if the current, voltage or impedance is to be measured. As the control surface could be scratched in time, it is recommended to additionally coat this portion of the surface with a protective layer, such as for example a suitable lacquer film. The protective layer should be completely transparent and optically adjusted to the fluorescent plate; if necessary, an adapting layer must be inserted, which matches the refractive indices of the protective film and of the plate to one another.

Figure 2:
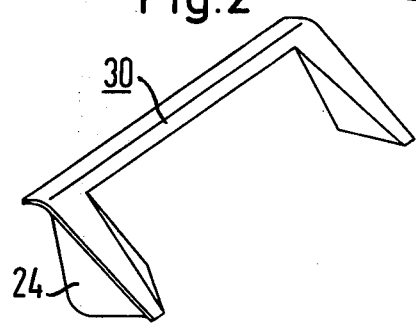
FIG. 2 is a pictorial representation of a display frame which is different from the display frame of FIG. 1.

The light-collecting surface of the fluorescent plate could even be increased if portions of the frame are removed. The lower cross strip, for example, seen in the viewing direction, could be considered for this purpose. Such a frame embodiment, illustrated in FIG. 2, offers a considerable gain in luminosity as plate areas are exposed which lie in proximity to the light emergence windows and transmit the collected light emergence windows practically unimpaired and over the shortest route.

In an apparatus constructed in accordance with the invention, the cover had the following dimensions:
Length (approx.)—153 mm
Width—100 mm
Thickness (approx.)—1.5 mm
Length—Portion 12—8.5 mm
Length—Portion 13—22 mm
Length—Portion 14—31.5 mm
Length—Portion 16—17 mm
Angles With Respect
To Plane of Portion 18
Portion 13—20°
Portion 14—35°
Portion 16—45°
Radii of Curvature
Axis 8—6.5 mm
Axis 9—3.5 mm
Axis 11—6.5 mm The invention is not delimited towards the exemplary embodiments described and illustrated herein. It is, in particular, left up to one skilled in the art, whether he produces the cover surface completely or only in part from a fluorescent plate, and which profile is provided for the fluorescent plate if it only carries the display in an inclined position. Moreover, the suggested housing version can be utilized in any type of measuring and regulating apparatus which has a data display, for example, in control units for infrared remote control of television apparatus or in thermometers which have a digital display. Therefore, I intend to include within the patent warranted hereon all changes of modifications as may reasonably and properly be included within the scope of my contribution to the art.

I claim:

1. A display apparatus comprising:
    an electro-optical display element including a generally rectangular display area having character display zones and edge-mounted electrical contacts;
    a housing including a generally rectangular upwardly open lower part and a cover, said cover being a fluorescent plate including a first portion which is parallel to said lower part of said housing, and a second portion disposed at an angle to said first portion, and third and fourth portions, said second portion supporting said display element at said angle and including at least one opening receiving said contacts therethrough and light emergence windows aligned with said character display zones, said cover comprising a material which has an index of refraction which is greater than one and contains particles which fluoresce, said cover including edges and refective material on at least some of said edges, the transitions of said second portion to the other portions being in accordance with the relationship $$R \geq (d \cdot n_f)/(n_f - n_a)$$

where R is the exterior radius of curvature, d is the thickness of said cover, $n_f$ is the index of refraction of said cover and $n_a$ is the index of refraction of air and, a frame disposed over said display element and secured to said cover.

2. The display apparatus of claim 1, wherein said first portion includes at least one aperture therethrough for receiving a control element of the apparatus.

3. The display apparatus of claim 1, wherein said first portion includes indicia formed as light emerging windows.

4. The display apparatus of claim 1, comprising:
a transparent protective lacquer layer covering said first portion and optically shaped to said fluorescent plate.

5. The display apparatus of claim 1, wherein said second and third portions have a V-shaped profile.

6. The display apparatus of claim 1, wherein said second and fourth portions have an inverted V-shaped profile.

7. The display apparatus of claim 1, wherein
said second portion includes a pair of openings for receiving said contacts therethrough, and
said frame includes a pair of tongues for plug-in receipt in said pair of openings.

8. The display apparatus of claim 7, wherein
said frame includes elongate sides and narrower transverse sides, and
said tongues extend from said narrower sides.

9. The display apparatus of claim 8, wherein said tongues included projections for engaging the interior of said housing.

10. The display apparatus of claim 1, comprising
a circuit board mounting within said housing including circuit board contacts, and
said display element contacts include a zebra contact rubber element for engaging said circuit board contacts.

11. The display apparatus of claim 10, wherein said tongue projections embrace said circuit board.

12. The display apparatus of claim 1, wherein said frame includes an upper side and a pair of end sides in a V-shaped configuration.

13. A display apparatus comprising:
an electro-optical display element including a generally rectangular display area having character display zones and edge-mounted contacts on the narrower edges of the rectangle, a housing including an upwardly open lower housing part and a cover, said lower housing part including a planar base, a pair of side walls and a pair of end walls, said cover including a fluorescent plate comprising first, second, third, fourth and fifth portions, said first portion being generally parallel to said planar base, said fifth portion being generally perpendicular to said planar base and to said first portion, said second, third and fourth portions being at angles with respect to said first and fifth portions, said third and fourth portions respectively connecting said first and fifth portions to said second portion to said first and fifth portions, respectively, said second portion including a pair of openings and including light emerging windows aligned with said character display zones and mounting said display element with said contacts extending through said openings, said cover is a fluorescent plate comprising a material having an index of refraction which is greater than one and particles which fluoresce, said cover also including edges and a reflective layer mounted on said edges, said transitions between said portions being in accordance with the relationship $$R \geq (d \cdot n_f)/(n_f - n_a)$$

where R is the exterior radius of curvature, d is the thickness of the fluorescent plate, $n_f$ is the index of refraction, and $n_a$ is the index of refraction of air and, a frame including at least two ends and a top which at least partially surround said display element, said, said frame including a pair of projections which are received in said openings of said second portion.

14. A display apparatus comprising:
an electro-optical display element including a generally rectangular display area having character display zones and edge-mounted electrical contacts;

a generally rectangular housing including an upwardly open lower part and a cover, said cover comprising a fluorescent plate including a first portion and a second portion integral with and disposed at an angle to said first portion with at least one radius of curvature therebetween, said second portion supporting said display element at said angle and including at least one opening receiving said contacts therethrough and light emergence windows aligned with said character display zones, said fluorescent plate comprising a material which has an index of refraction which is greater than one and contains particles which fluoresce, the transitions at each said radius of curvature in accordance with the relationship $$R \geq (d \cdot n_f)/(n_f - n_a)$$

where R is the exterior radius of curvature, d is the thickness of said cover, $n_f$ is the index of refractions of said cover and $n_a$ is the index of refraction of the use environment.

15. In an apparatus of the type which has a generally planar base on an upwardly open housing and a cover closing the opening which has a first portion generally parallel to the plane of the base, and a second portion at an angle to the plane of the base which supports an electro-optical display having a plurality of character display areas, the improvement wherein:

said cover comprises a material having an index of refraction greater than one and which contains particles which fluoresce, and light-emergence openings located in alignment with the character display areas, and the transition between the first and second cover portions is in accordance with the expression $$R \gtrsim (d \cdot n_f)/(n_f - n_a)$$

where R is the radius of curvature, d is the thickness of the cover, $n_f$ is the index of refraction of the material and $n_a$ is the index of refraction of the use environment.

16. The improved apparatus of claim 15, wherein:
   said cover has peripheral edges and comprises reflective coating on said edges.

17. The improved apparatus of claim 15, further comprising a protective lacquer coating on the first cover portion.

18. The improved apparatus of claim 17, further comprising an intermediate coating carrying said lacquer coating and matching the index of refraction thereof to that of said cover.

* * * * *